(12) United States Patent
Polei et al.

(10) Patent No.: US 7,074,678 B2
(45) Date of Patent: Jul. 11, 2006

(54) METHOD FOR FABRICATING A BURIED BIT LINE FOR A SEMICONDUCTOR MEMORY

(75) Inventors: Veronika Polei, Dresden (DE); Mayk Röhrich, Dresden (DE); Achim Gratz, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/623,843

(22) Filed: Jul. 21, 2003

(65) Prior Publication Data

US 2004/0018686 A1 Jan. 29, 2004

(30) Foreign Application Priority Data

Jul. 19, 2002 (DE) ................. 102 32 938

(51) Int. Cl.
*H01L 21/336* (2006.01)
(52) U.S. Cl. .................. 438/262; 438/265
(58) Field of Classification Search ......... 438/240, 438/249, 262, 265
See application file for complete search history.

(56) References Cited

U.S. PATENT DOCUMENTS

| | | | |
|---|---|---|---|
| 4,947,222 A | 8/1990 | Gill et al. | |
| 5,168,334 A | 12/1992 | Mitchell et al. | |
| 5,545,907 A | 8/1996 | Maari | |
| 5,627,092 A * | 5/1997 | Alsmeier et al. | ........... 438/152 |
| 5,768,192 A | 6/1998 | Eitan | |
| 5,841,163 A | 11/1998 | Joo et al. | |
| 5,966,603 A | 10/1999 | Eitan | |
| 6,011,725 A | 1/2000 | Eitan | |
| 6,063,658 A * | 5/2000 | Horak et al. | ................. 438/248 |
| 6,168,992 B1 * | 1/2001 | Lee | ............................. 438/256 |
| 6,172,396 B1 | 1/2001 | Chang | |
| 6,204,122 B1 * | 3/2001 | Joo et al. | ..................... 438/257 |
| 6,242,305 B1 | 6/2001 | Foote et al. | |
| 6,261,924 B1 * | 7/2001 | Mandelman et al. | ........ 438/430 |
| 6,326,268 B1 * | 12/2001 | Park et al. | ................... 438/262 |
| 6,403,419 B1 * | 6/2002 | Kim et al. | .................... 438/257 |
| 6,429,068 B1 * | 8/2002 | Divakaruni et al. | ......... 438/243 |
| 6,436,766 B1 * | 8/2002 | Rangarajan et al. | ......... 438/261 |
| 6,468,865 B1 * | 10/2002 | Yang et al. | ................. 438/262 |
| 6,501,131 B1 * | 12/2002 | Divakaruni et al. | ......... 257/344 |
| 6,518,103 B1 * | 2/2003 | Lai | ............................. 438/150 |
| 6,548,861 B1 * | 4/2003 | Palm et al. | ................. 257/330 |
| 6,566,219 B1 * | 5/2003 | Kunkel et al. | .............. 438/386 |
| 6,794,249 B1 * | 9/2004 | Palm et al. | ................. 438/259 |
| 2003/0151091 A1 * | 8/2003 | Palm et al. | ................. 257/330 |

FOREIGN PATENT DOCUMENTS

WO 99/60631 11/1999

* cited by examiner

*Primary Examiner*—W. David Coleman
*Assistant Examiner*—Khiem D. Nguyen
(74) *Attorney, Agent, or Firm*—Laurence A. Greenberg; Werner H. Stemer; Ralph E. Locher

(57) ABSTRACT

In a method for fabricating a buried bit line for a semiconductor memory, the buried bit line is produced as a diffusion region using a dopant source including polysilicon that has previously been applied above the region intended for the buried bit line. This keeps the extent of diffusion within limits and means that the doped polysilicon is particularly suitable for the formation of the insulating oxide region above the buried bit line, due to the rapid oxidation.

4 Claims, 3 Drawing Sheets

_US 7,074,678 B2_

METHOD FOR FABRICATING A BURIED BIT LINE FOR A SEMICONDUCTOR MEMORY

BACKGROUND OF THE INVENTION

Field of the Invention

The present invention relates to a method for fabricating a buried bit line for a SONOS memory, in which an insulating oxide region is formed between the buried bit line and the gate electrode.

In SONOS memories, in particular in NROM memories (for example U.S. Pat. Nos. 5,768,192 and 6,011,725 and International Patent Application No. WO 99/60631), buried bit lines are produced in semiconductor material by the material being electrically conductively doped by the introduction of dopant. Parts of these bit lines simultaneously form the source/drain regions of the transistors of the individual memory cells. Therefore, the buried bit lines are adjoined by the channel regions to which a gate dielectric, on which the corresponding gate electrode is disposed, is applied. Connected to the gate electrodes are the word lines, which run transversely with respect to the buried bit lines and are electrically insulated therefrom via the bit lines. To keep the capacitive coupling between the buried bit lines and the word lines and/or the respectively adjacent gate electrodes as low as possible, the oxide region in question above the bit line has to be sufficiently thick and disposed in self-aligned fashion with respect to the bit line. At the same time, it is necessary to ensure that the edge of the lower boundary surface of the source/drain region or of the buried bit line, known as the junction, runs at the correct, predetermined distance from the gate electrode.

The gate dielectric is formed by a layer sequence that includes a storage layer, which is intended to trap charge carriers at source and drain, between boundary layers. The material of the boundary layers has a higher energy band gap than the material of the storage layer, so that the charge carriers which are trapped in the storage layer between the boundary layers remain located there.

A suitable material for the storage layer is preferably a nitride; primarily an oxide is suitable as the surrounding material. In the case of a memory cell using the silicon material system, the memory cell is in this example silicon nitride with an energy band gap of approximately 5 eV, and the surrounding boundary layers are silicon oxide with an energy band gap of approximately 9 eV. The storage layer may be a different material with a lower energy band gap than that of the boundary layers. In which case, the difference between the energy band gaps should be as high as possible for good electrical confinement of the charge carriers. In conjunction with silicon oxide, it is possible, for example, to use tantalum oxide ($Ta_2O_5$ in the case of a stoichiometric composition), hafnium oxide ($HfO_2$ in the case of a stoichiometric composition), hafnium silicate, titanium oxide ($TiO_2$ in the case of a stoichiometric composition), zirconium oxide ($ZrO_2$ in the case of a stoichiometric composition), aluminum oxide ($Al_2O_3$ in the case of a stoichiometric composition) or intrinsically conductive (undoped) silicon as material for the storage layer. The relative permitivity of the material of the storage layer is preferably greater than four (4).

A configuration of this type can be fabricated by using a mask to etch openings into the gate dielectric in the region of the bit lines which are to be produced and then introducing dopant into the semiconductor material. A subsequent oxidation has to be carried out until a sufficiently thick oxide region is formed above the buried bit line. This, however, gives rise to the problem that, due to the action of heat, the dopant diffuses out of the implanted region and passes too far into the region below the gate dielectric, i.e. too close to the gate electrode which is to be applied. The difficulties that are present in the prior art can be seen from the appended FIGS. 1 and 2, which illustrate cross sections through intermediate products of the method used to fabricate an NROM memory using the conventional method steps.

A first oxide layer 3, a nitride layer 4 and a second oxide layer 5 are applied on top of one another over the entire surface above a semiconductor body 1 or substrate made from semiconductor material. This ONO layer sequence is provided as gate dielectric. A resist mask 7 is applied to the second oxide layer 5 and is used to etch out openings 8 in the region of the bit lines that are to be produced. These openings 8 extend at least as far as into the first oxide layer 3. Any residual layer fraction of the first oxide layer 3 which may remain is sufficiently thin for it to be possible for dopant to be introduced into an implantation region 9 of the semiconductor body 1. This dopant is intended to form the buried bit lines. This is followed by an oxidation step which is used to produce an oxide layer which covers the implantation regions.

FIG. 2 illustrates the result of the oxidation process. The free surfaces and edges of the nitride layer 4 have been oxidized. Between the parts of the nitride layer 4 there is in each case an oxide region 6 which is significantly thicker than the first oxide layer 3. This oxide region 6 electrically separates the buried bit line, which has been formed by the doped region 2, from a gate electrode which is to be applied to the second oxide layer 5 above the nitride layer 4. However, due to the thermal diffusion of the dopant caused by the oxidation process, the lateral parts 20 of the doped region 2 project well below the region covered by the nitride layer 4, so that the junctions 21, i.e. the outer edges of the boundary surfaces of the doped regions 2, in each case lie very far into the interior of the region covered by the nitride layer 4. Consequently, the doped region 2 extends too far into the region which is subsequently covered by the gate electrode and is not electrically insulated on the top side by the oxide region 6. This undesirable structure can only be avoided by making the preceding oxidation process shorter. In this case, however, the oxide region 6 can only be produced with a reduced thickness, which in turn entails poor decoupling of the buried bit lines from the word lines below.

SUMMARY OF THE INVENTION

It is accordingly an object of the invention to provide a method for fabricating a buried bit line for a semiconductor memory that overcomes the hereinafore-mentioned disadvantages of the heretofore-known devices of this general type and that provides a method for fabricating buried bit lines for SONOS memories in which the edges of the buried bit lines can be disposed at a predetermined distance from the edges of the gate electrodes and at the same time it is possible to produce a sufficiently thick oxide insulation in self-aligned fashion.

With the foregoing and other objects in view, there is provided, in accordance with the invention, a method for fabricating a buried bit line for a semiconductor memory. The method includes producing strip-like doped regions parallel to and at distances from one another in a semiconductor body. The regions are adapted to act as bit lines and as source/drain regions of a respective memory transistor. The next step is applying laterally with respect to the doped regions, in each case, one layer sequence adapted to act as a gate dielectric and including a lower boundary layer, a storage layer, and an upper boundary layer. The next step is forming an oxide region in each case on a side of the doped regions remote from the semiconductor body. The oxide region is thicker than the lower boundary layer. Before the upper boundary layer is applied, a sacrificial layer is applied. The sacrificial layer is made from polysilicon and a material selectively etchable with respect to a material of the storage layer to the storage layer. The next step is producing openings in the sacrificial layer, the storage layer, and the lower boundary layer, extending to the semiconductor body, by using a mask. The next step is introducing doped polysilicon into the openings. The next step is removing the sacrificial layer. The next step is producing the upper boundary layer on the storage layer and oxidizing at least a proportion of the polysilicon to form the oxide region.

With the objects of the invention in view, there is also provided a method for fabricating a buried bit line for a semiconductor memory. The method includes producing strip-like doped regions parallel to and at distances from one another in a semiconductor body. The strip-like doped regions are adapted to act as bit lines and as source/drain regions of a respective memory transistor. The next step is applying laterally with respect to the doped regions, in each case, one layer sequence adapted to act as a gate dielectric and including a lower boundary layer, a storage layer, and an upper boundary layer. The next step is forming an oxide region thicker than the lower boundary layer, in each case, on a side of the doped region remote from the semiconductor body. Before producing the upper boundary layer, a sacrificial layer with a topside is applied to the storage layer. The next step is producing openings with lateral walls in the sacrificial layer, the storage layer, and the lower boundary layer, by using a mask. The next step is introducing dopant into implantation regions of the semiconductor body through the openings. The next step is etching back the lateral walls of the openings and a topside of the sacrificial layer at an etching rate sufficient to form smooth flanks or sides on the sacrificial layer, the storage layer, and the lower boundary layer. The next step is removing residues of the sacrificial layer selectively with respect to the storage layer. The next step is producing the upper boundary layer on the storage layer and forming an oxide region on a free surface of the semiconductor body, in each case between the flanks or sides.

In the method, the buried bit line is produced using a dopant source including polysilicon that has previously been applied above the region that is intended for the buried bit line. In this way, the extent of diffusion is kept within appropriate limits and the doped polysilicon is particularly suitable for forming the insulating oxide regions above the buried bit lines due to the rapid oxidation. An alternative method provides for a layer sequence intended for the gate dielectric initially to be replaced by only part of this layer sequence, which is completed by a thicker sacrificial layer on the top side. After implantations of dopant for the buried bit lines have taken place in the intended regions, the layer sequence that has been applied is etched back until in each case a specific predetermined distance has been set between the implanted regions and the remaining parts of the layer sequence. Since this leads to a greater proportion of the top side of the semiconductor material being uncovered, subsequent oxidation of the semiconductor material results in a significantly wider oxide region above the buried bit lines. The dopant that has been introduced does not diffuse much further than the edge of this oxide region and does not reach well below the remaining parts of the layer sequence provided for the gate dielectric. The more lightly doped edge regions of the buried bit lines are therefore covered by a thicker oxide region than is achieved with conventional methods.

Other features that are considered as characteristic for the invention are set forth in the appended claims.

Although the invention is illustrated and described herein as embodied in a method for fabricating a buried bit line for a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
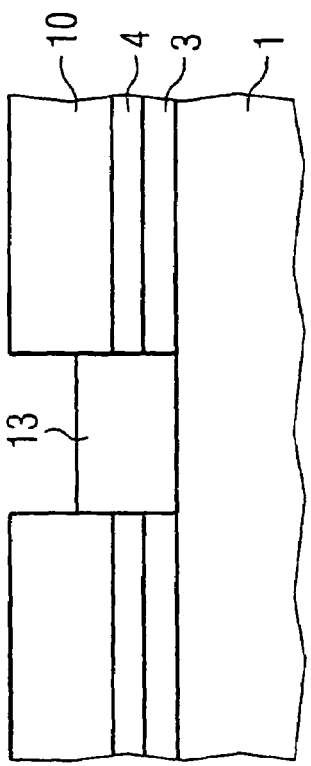
FIGS. 3 to 6 are cross sectional views showing intermediate products of a first embodiment of the method according to the invention.

Referring now to the figures of the drawings in detail and first, particularly to FIG. 3 thereof, there is shown a cross section through a semiconductor body 1 to which first of all a lower boundary layer 3, for example a first oxide layer, and a memory layer 4, for example a nitride layer, have been applied. Then, instead of the upper boundary layer, first of all a sacrificial layer 10 is applied, for which in particular a deposited oxide using TEOS (tetraethyl orthosilicate), DCS (dichlorosilane), HCS (hexachlorosilane) or the like or an HDP (high density plasma) oxide is suitable. Then, in a subsequent photolithography step, openings are produced in this layer sequence in the region of the buried bit lines which are to be produced. Then, polysilicon 11 is deposited, filling the openings.

Figure 4:
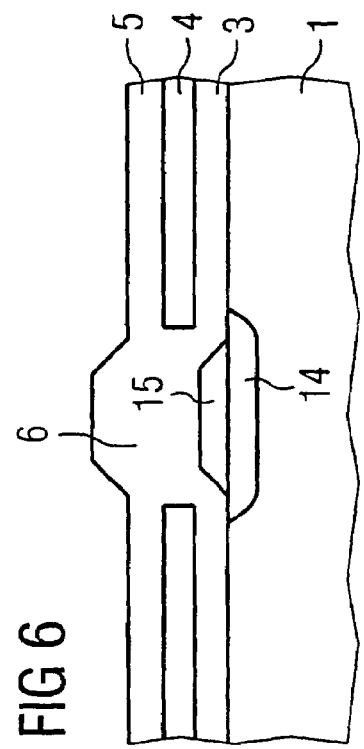

In accordance with the cross section shown in FIG. 4, it is possible first of all to produce spacers 12 at the walls of the openings 8 before the deposition of the polysilicon 11, in order to accurately set the trench width.

Figure 5:
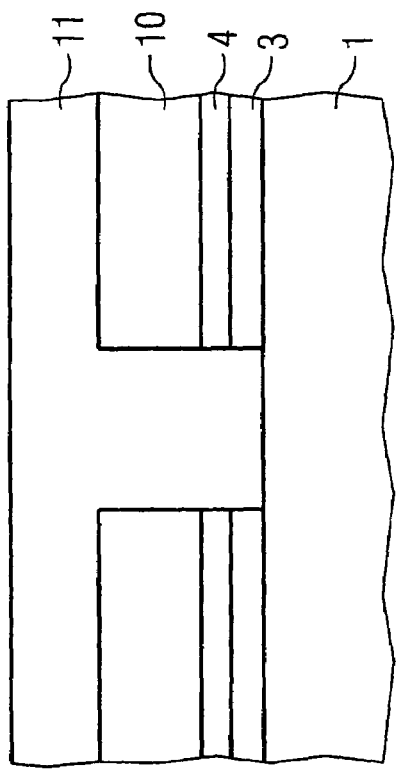

During the deposition, or subsequently, the polysilicon 11 is electrically conductively doped, which can be achieved in particular using arsenic as dopant. In accordance with the illustration shown in FIG. 5, the polysilicon 11 is etched back to a residual proportion 13. The sacrificial layer 10 is then removed, with the nitride layer 4 being used as an etching stop layer.

Figure 6:
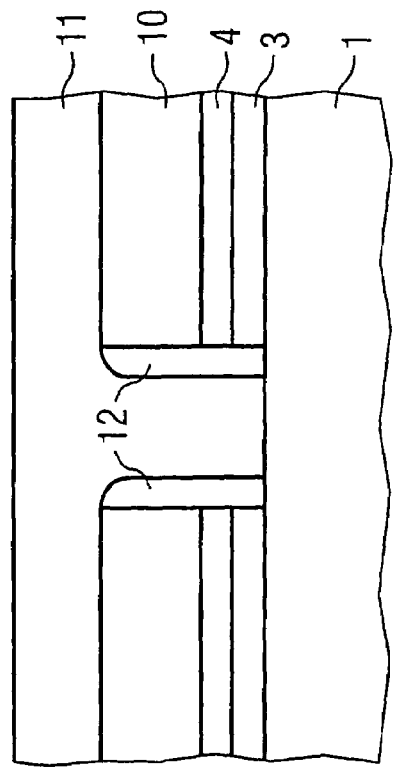

Then, the upper boundary layer 5, for example a second oxide layer, is applied to the surface of the configuration, resulting in the structure illustrated in cross section in FIG. 6. For this purpose, in the example, it is preferable to perform a wet oxidation, so that an upper sublayer of the nitride layer is also oxidized. In the case of a dry oxidation, the entire second oxide layer has to be applied separately. In this oxidation method step, the remaining proportion 13 of the polysilicon is oxidized to a greater extent, so that the relatively thick oxide region 6 is formed. Moreover, the dopant diffuses out of the polysilicon into the semiconductor material of the semiconductor body 1, where it forms the diffusion region 14 shown, which has a smaller lateral extent than a doped region 2 which is produced in accordance with the prior art and is intended to form the buried bit line. It is preferable for a residue 15 of the polysilicon to be left in place above the diffusion region 14, so that a thin film of a uniformly high dopant concentration is present on the buried bit lines. This is because the diffusion leads to a Gaussian profile of the dopant being established in the diffusion region 14. Therefore, a residual polysilicon strip of uniform dopant concentration is advantageous for subsequent application of the connection contacts above the buried bit lines. However, it is also possible to completely oxidize the polysilicon. In principle, the oxidation process may even be continued until a proportion of the semiconductor body 1 has also been oxidized. The buried bit lines are then formed exclusively by the diffusion region 14 in question. However, the first exemplary embodiment is preferred for the reasons which have been mentioned. Moreover, a residual polysilicon strip has the advantage that the bulk resistance of the bit lines is lower.

With this method, it is possible to accurately set the properties of the SONOS cells over a wide range. In particular, when using the spacers 12 as shown in FIG. 4, it is possible to set the position of the junctions of the buried bit line and of the edge of the gate electrode very accurately with respect to one another. Using this method, it is possible to reduce the technology scale to below 170 nm (shrinkage).

Figure 7:
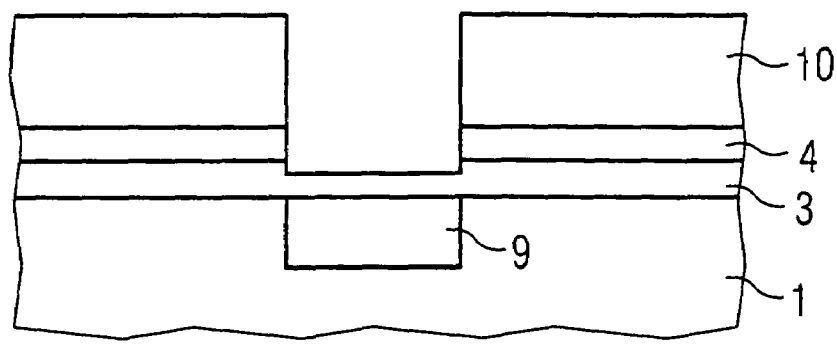
FIGS. 7 to 9 are cross sectional views showing intermediate products of a second embodiment of the method according to the invention.

Another possible way of producing the oxide region 6 in sufficient width above the buried bit line provides for lateral etching back of the storage layer 4, for example the nitride layer, instead of diffusion of the dopant into the bit line. In accordance with the cross section illustrated in FIG. 7, in this variant of the method too, first of all the lower boundary layer 3, for example a first oxide layer, the storage layer 4, for example a nitride layer, and the sacrificial layer 10 are applied to the semiconductor body 1. The openings through which dopant is introduced in order to form implantation regions 9 are produced using a suitable photolithography process. The openings can be formed all the way down to the semiconductor body 1; alternatively, it is possible to leave a thin residual sublayer of the lower boundary layer 3, as illustrated in FIG. 7, on the semiconductor material. In this case too, a deposited oxide (TEOS) is particularly suitable as the sacrificial layer.

Figure 8:
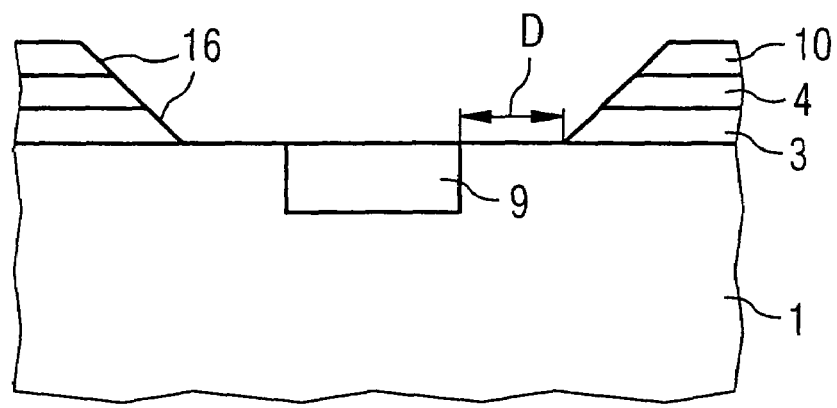

The lower boundary layer 3, the storage layer 4 and the sacrificial layer 10 are then etched back isotropically, as illustrated in FIG. 8, so that approximately the inclined flanks or sides 16 are formed on both sides of the implantation region 9. In the example described, in particular a buffered solution of HF and ethylene glycol is a suitable etchant, since this etchant etches the nitride of the storage layer and the oxide approximately equally strongly. The lower boundary layer 3 and the storage layer 4 are in this way set back by a distance D from the implantation region 9.

Figure 1:
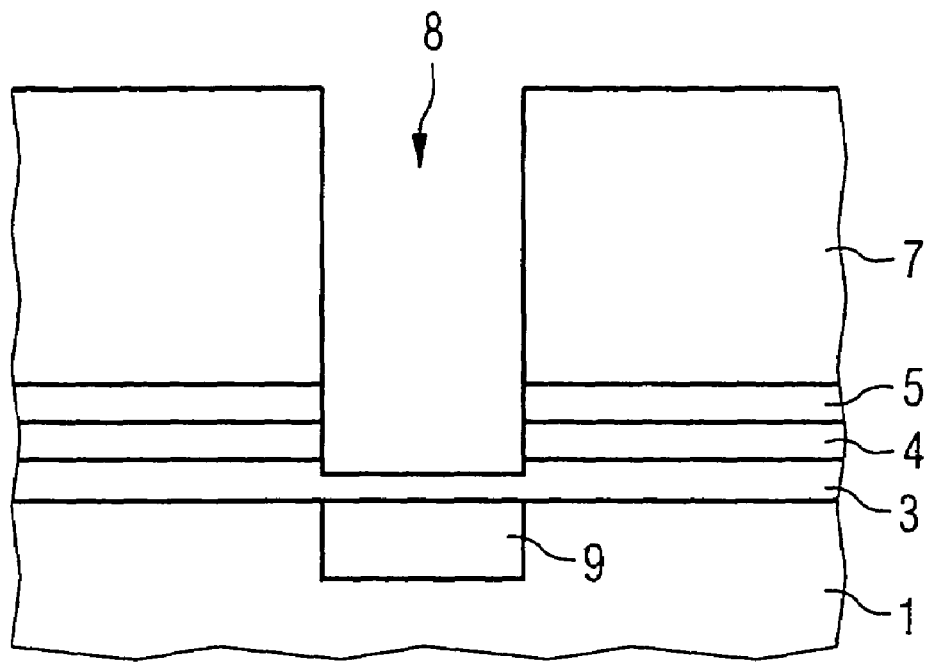
FIGS. 1 and 2 are cross sectional views through intermediate products made by prior-art methods.
Figure 2:
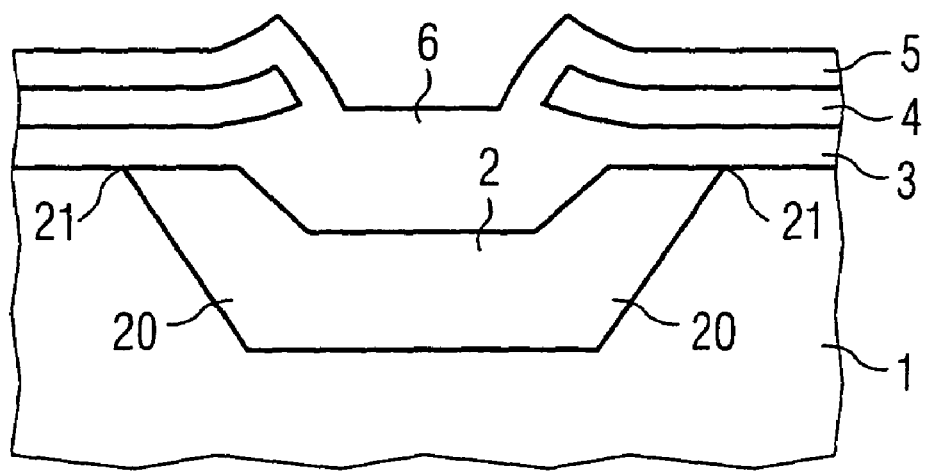
Figure 9:
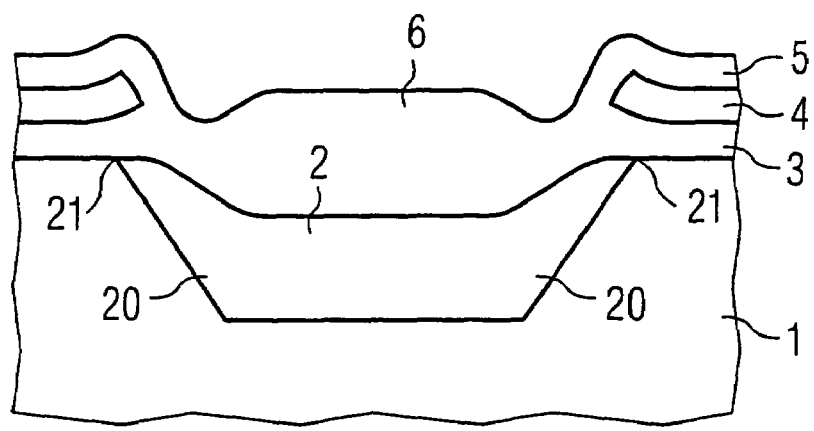

The structure illustrated in cross section in FIG. 9 is obtained by subsequent oxidation of the semiconductor material which is now uncovered at the top side of the semiconductor body 1. As can be seen from the cross section illustrated in FIG. 9 by comparison with the corresponding cross section shown in FIG. 2, this method, unlike the prior art, makes it possible to produce an oxide region 6 that covers the doped region 2 of the buried bit line over almost the entire width, so that the junctions 21 of the doped region 2 extend at most slightly below the edges of the storage layer 4. The lateral proportions 20 of the doped region are located mostly beneath the oxide regions 6. This results in improved electrical insulation compared to the gate electrodes which are to be applied to the top side of the upper boundary layer 5 laterally with respect to the doped region too. Therefore, with this variant of the method too, it is possible for the relative position of the junctions and the edges of the gate electrode to be set very accurately in the desired way.

We claim:

1. A method for fabricating a buried bit line for a semiconductor memory, which comprises:
    producing strip-like doped regions parallel to and at distances from one another in a semiconductor body, the strip-like doped regions being adapted to act as bit lines and as source/drain regions of a respective memory transistor;
    applying laterally with respect to the doped regions, in each case, one layer sequence adapted to act as a gate dielectric and including a lower boundary layer, a storage layer, and an upper boundary layer; and
    forming an oxide region thicker than the lower boundary layer, in each case, on a side of the doped region remote from the semiconductor body;
    before producing the upper boundary layer and after the application of the storage layer, applying a sacrificial layer with a topside to the storage layer;
    producing openings with lateral walls in the sacrificial layer, the storage layer, and the lower boundary layer, by using a mask; introducing dopant into implantation regions of the semiconductor body through the openings;
    etching back the lateral walls of the openings and a topside of the sacrificial layer at an etching rate sufficient to form smooth sides on the sacrificial layer, the storage layer, and the lower boundary layer;
    removing residues of the sacrificial layer selectively with respect to the storage layer; and
    producing the upper boundary layer on the storage layer and forming an oxide region on a free surface of the semiconductor body, in each case between the sides.

2. The method according to claim 1, which further comprises heating until the dopant introduced into the implantation regions has diffused to a portion of the semiconductor body covered by the storage layer.

3. The method according to claim 1, wherein the sacrificial layer is produced as a deposited oxide.

4. The method according to claim 1, which further comprises selecting the storage layer from a group of materials consisting of silicon nitride, tantalum oxide, hafnium oxide, hafnium silicate, titanium oxide, zirconium oxide, aluminum oxide, and intrinsically conductive silicon.

* * * * *